(12) United States Patent
Chien et al.

(10) Patent No.: US 8,674,452 B2
(45) Date of Patent: Mar. 18, 2014

(54) SEMICONDUCTOR DEVICE WITH LOWER METAL LAYER THICKNESS IN PMOS REGION

(75) Inventors: Chin-Cheng Chien, Tainan (TW); Tzung-Ying Lee, Ping-Tung County (TW); Tsuo-Wen Lu, Kaohsiung (TW); Shu-Yen Chan, Changhua County (TW); Jei-Ming Chen, Tainan (TW); Yu-Min Lin, Tainan (TW); Chun-Wei Hsu, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 214 days.

(21) Appl. No.: 13/167,738

(22) Filed: Jun. 24, 2011

(65) Prior Publication Data

US 2012/0326238 A1 Dec. 27, 2012

(51) Int. Cl.
*H01L 21/70* (2006.01)
(52) U.S. Cl.
USPC ............ 257/369; 257/368; 438/229; 438/585
(58) Field of Classification Search
USPC .................. 257/369, 368, 288, 213, E12.632, 257/E21.19, E21.062; 438/229, 585
See application file for complete search history.

(56) References Cited

U.S. PATENT DOCUMENTS

| | | | |
|---|---|---|---|
| 5,892,282 A | 4/1999 | Hong | |
| 6,096,659 A | 8/2000 | Gardner | |
| 6,177,303 B1 | 1/2001 | Schmitz | |
| 6,303,418 B1 | 10/2001 | Cha | |
| 6,458,684 B1 | 10/2002 | Guo | |
| 6,573,134 B2 | 6/2003 | Ma | |
| 6,960,416 B2 | 11/2005 | Mui | |
| 7,126,199 B2 | 10/2006 | Doczy | |
| 7,144,783 B2 | 12/2006 | Datta | |
| 7,148,548 B2 | 12/2006 | Doczy | |
| 7,153,784 B2 | 12/2006 | Brask | |
| 7,176,090 B2 | 2/2007 | Brask | |
| 7,186,605 B2 | 3/2007 | Cheng | |
| 7,208,361 B2 | 4/2007 | Shah | |
| 7,217,611 B2 | 5/2007 | Kavalieros | |
| 7,355,281 B2 | 4/2008 | Brask | |
| 7,407,876 B2 | 8/2008 | Ishizaka | |
| 7,556,998 B2 | 7/2009 | Park | |
| 7,700,479 B2 | 4/2010 | Huang | |
| 2006/0024953 A1 | 2/2006 | Papa Rao | |
| 2007/0145591 A1 | 6/2007 | Yano | |
| 2007/0178634 A1* | 8/2007 | Jung et al. | ..................... 438/199 |
| 2007/0259519 A1 | 11/2007 | Yang | |
| 2007/0262451 A1 | 11/2007 | Rachmady | |
| 2007/0272123 A1 | 11/2007 | Kennedy | |

(Continued)

*Primary Examiner* — Julio J Maldonado
*Assistant Examiner* — Robert Bachner
(74) *Attorney, Agent, or Firm* — Winston Hsu; Scott Margo

(57) ABSTRACT

A semiconductor device includes: a substrate having a first region and a second region; a first gate structure disposed on the first region, wherein the first gate structure comprises a first high-k dielectric layer, a first work function metal layer, and a first metal layer disposed between the first high-k dielectric layer and the first work function metal layer; and a second gate structure disposed on the second region, wherein the second gate structure comprises a second high-k dielectric layer, a second work function metal layer, and a second metal layer disposed between the second high-k dielectric layer and the second work function metal layer, wherein the thickness of the second metal layer is lower than the thickness of the first metal layer.

5 Claims, 9 Drawing Sheets

(56) References Cited

U.S. PATENT DOCUMENTS

| | | |
|---|---|---|
| 2008/0076216 A1 | 3/2008 | Pae |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0052066 A1* | 3/2010 | Yu et al. .................. 257/369 |
| 2010/0065926 A1 | 3/2010 | Yeh |
| 2010/0068877 A1 | 3/2010 | Yeh |
| 2010/0087055 A1 | 4/2010 | Lai |
| 2010/0124818 A1 | 5/2010 | Lee |
| 2010/0244141 A1 | 9/2010 | Beyer |
| 2011/0070702 A1* | 3/2011 | Chien et al. .................. 438/211 |

* cited by examiner

SEMICONDUCTOR DEVICE WITH LOWER METAL LAYER THICKNESS IN PMOS REGION

BACKGROUND OF THE INVENTION

1. Field of the Invention

The invention relates to a method for fabricating a semiconductor device, and more particularly, to a method for fabricating a metal gate CMOS transistor.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

It is an objective of the present invention to provide a method for fabricating metal gate CMOS device with dual work function metal layer.

According to a preferred embodiment of the present invention, a method for fabricating semiconductor device includes the steps of: providing a substrate having a first region and a second region thereon; forming a high-k dielectric layer, a barrier layer, and a first metal layer on the substrate; removing the first metal layer of the second region; forming a polysilicon layer to cover the first metal layer of the first region and the barrier layer of the second region; patterning the polysilicon layer, the first metal layer, the barrier layer, and the high-k dielectric layer to form a first gate structure and a second gate structure in the first region and the second region; and forming a source/drain in the substrate adjacent to two sides of the first gate structure and the second gate structure.

According to another aspect of the present invention, a method for fabricating semiconductor device includes the steps of: providing a substrate having a first region and a second region thereon; forming a first gate structure and a second gate structure on the first region and the second region; forming a dielectric layer to cover the first gate structure and the second gate structure; performing a first planarizing process to partially remove the dielectric layer such that the surfaces of the first gate structure and the second structure are even with the surface of the dielectric layer; forming a recess in the first gate structure and the second structure respectively; forming a high-k dielectric layer, a barrier layer, and a first metal layer on the surfaces of the dielectric layer and the recess of the first region and the second region; removing the first metal layer of the second region; and forming a second metal layer on the first metal layer of the first region and the dielectric layer of the second region.

Another aspect of the present invention provides a method for fabricating semiconductor device, which includes the steps of: providing a substrate having a first region and a second region thereon; forming a first gate structure and a second gate structure on the first region and the second region; forming a dielectric layer to cover the first gate structure and the second gate structure; performing a first planarizing process to partially remove the dielectric layer such that the surfaces of the first gate structure and the second structure are even with the surface of the dielectric layer; forming a recess in the first gate structure and the second structure respectively; forming a high-k dielectric layer, a barrier layer, and a first metal layer on the surfaces of the dielectric layer and the recess of the first region and the second region; and removing the first metal layer of the second region.

Another aspect of the present invention provides a semiconductor device, which includes: a substrate having a first region and a second region; a first gate structure disposed on the first region, wherein the first gate structure comprises a first high-k dielectric layer, a first work function metal layer, and a first metal layer disposed between the first high-k dielectric layer and the first work function metal layer; a second gate structure disposed on the second region, wherein the second gate structure comprises a second high-k dielectric layer, a second work function metal layer, and a second metal layer disposed between the second high-k dielectric layer and the second work function metal layer, wherein the thickness of the second metal layer is lower than the thickness of the first metal layer; a first source/drain disposed in the substrate adjacent to two sides of the first gate structure; and a second source/drain disposed in the substrate adjacent to two sides of the second gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
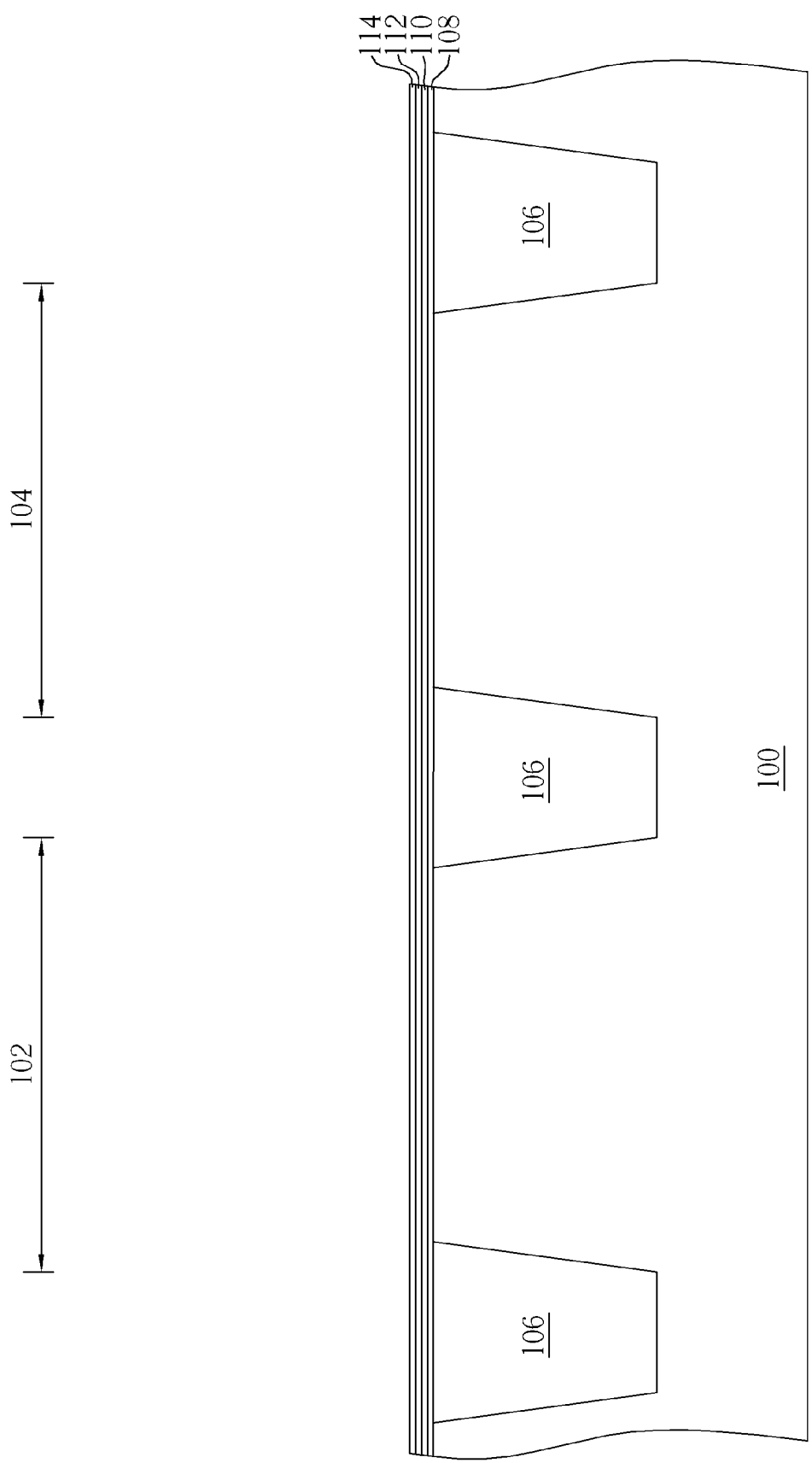
FIGS. 1-9 illustrate a method for fabricating a semiconductor device having metal gate according to a preferred embodiment of the present invention.

Referring to FIGS. 1-9, FIGS. 1-9 illustrate a method for fabricating a semiconductor device having metal gate according to a preferred embodiment of the present invention. In this embodiment, the semiconductor device is preferably a CMOS transistor, in which the method preferably utilizes a gate-last approach accompanying a high-k first fabrication. As shown in FIG. 1, a substrate 100, such as a silicon substrate or a silicon-on-insulator (SOI) substrate is provided. A first region and a second region are defined on the substrate 100, such as a PMOS region 102 and a NMOS region 104. A plurality of shallow trench isolations (STI) 106 are formed in the substrate 100 for separating the two transistor regions.

An interfacial layer 108 composed of dielectric material such as oxides or nitrides is formed on the surface of the substrate 100, and a stacked film composed of a high-k dielectric layer 110, a barrier layer 112, and a metal layer 114 is formed on the interfacial layer 108.

In this embodiment, the high-k dielectric layer 110 could be a single-layer or a multi-layer structure containing metal oxide layer such as rare earth metal oxide, in which the dielectric constant of the high-k dielectric layer 110 is substantially greater than 20. For example, the high-k dielectric layer 110 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Preferably, the barrier layer 112 is composed of TiN and the metal layer 114 is composed of TaN, in which the metal layer 114 is formed on the barrier layer 112 through an atomic layer deposition (ALD) process and the depth of the metal layer 114 is between several Angstroms to dozen Angstroms, such as about 20 Angstroms.

Figure 2:
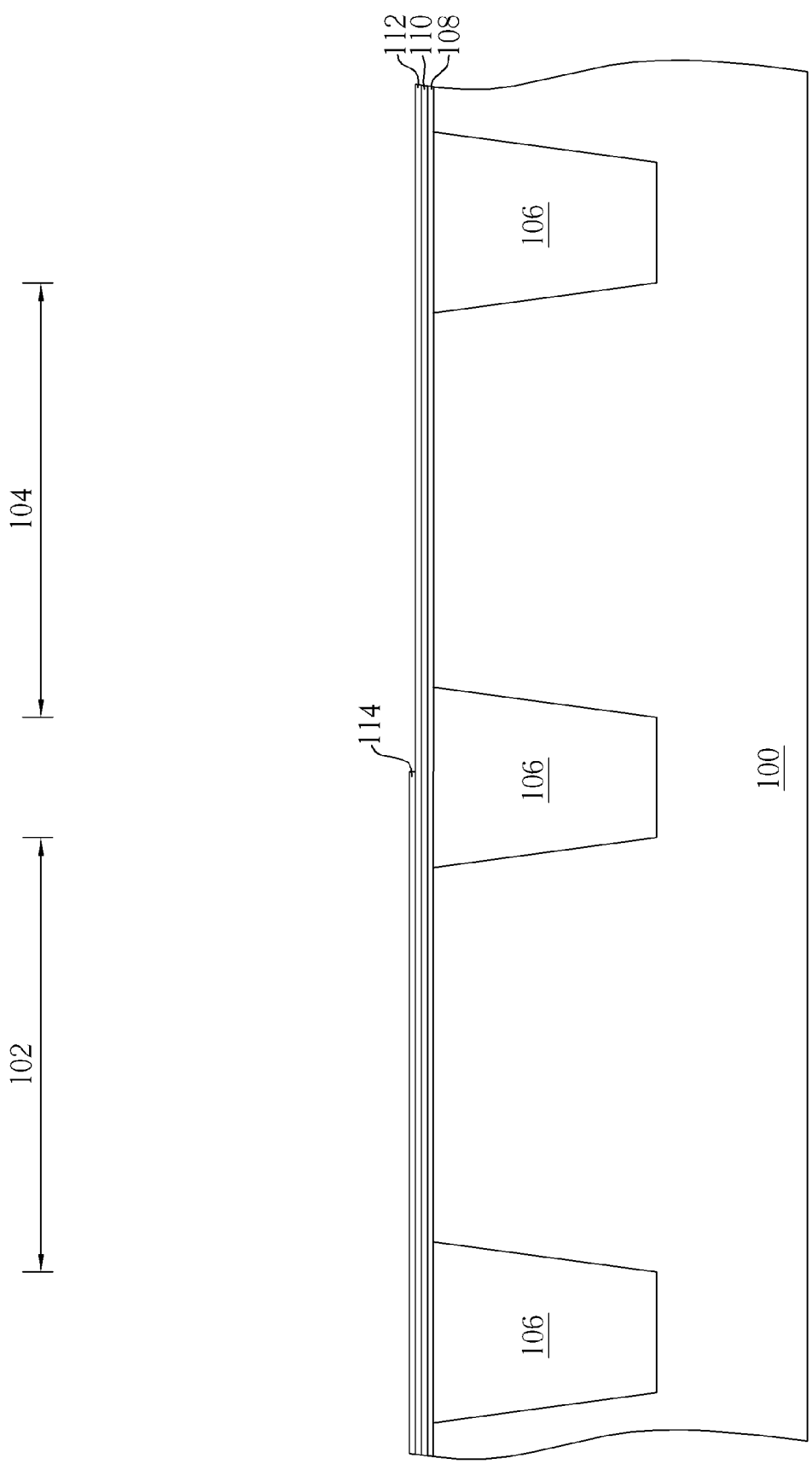

As shown in FIG. 2, a patterned resist (not shown) is formed on the metal layer 114, and a pattern transfer is carried by using the patterned resist as mask to partially remove the metal layer 114 of the PMOS region 104. After stripping the patterned resist, a patterned metal layer 114 is formed on the NMOS region 102.

Figure 3:
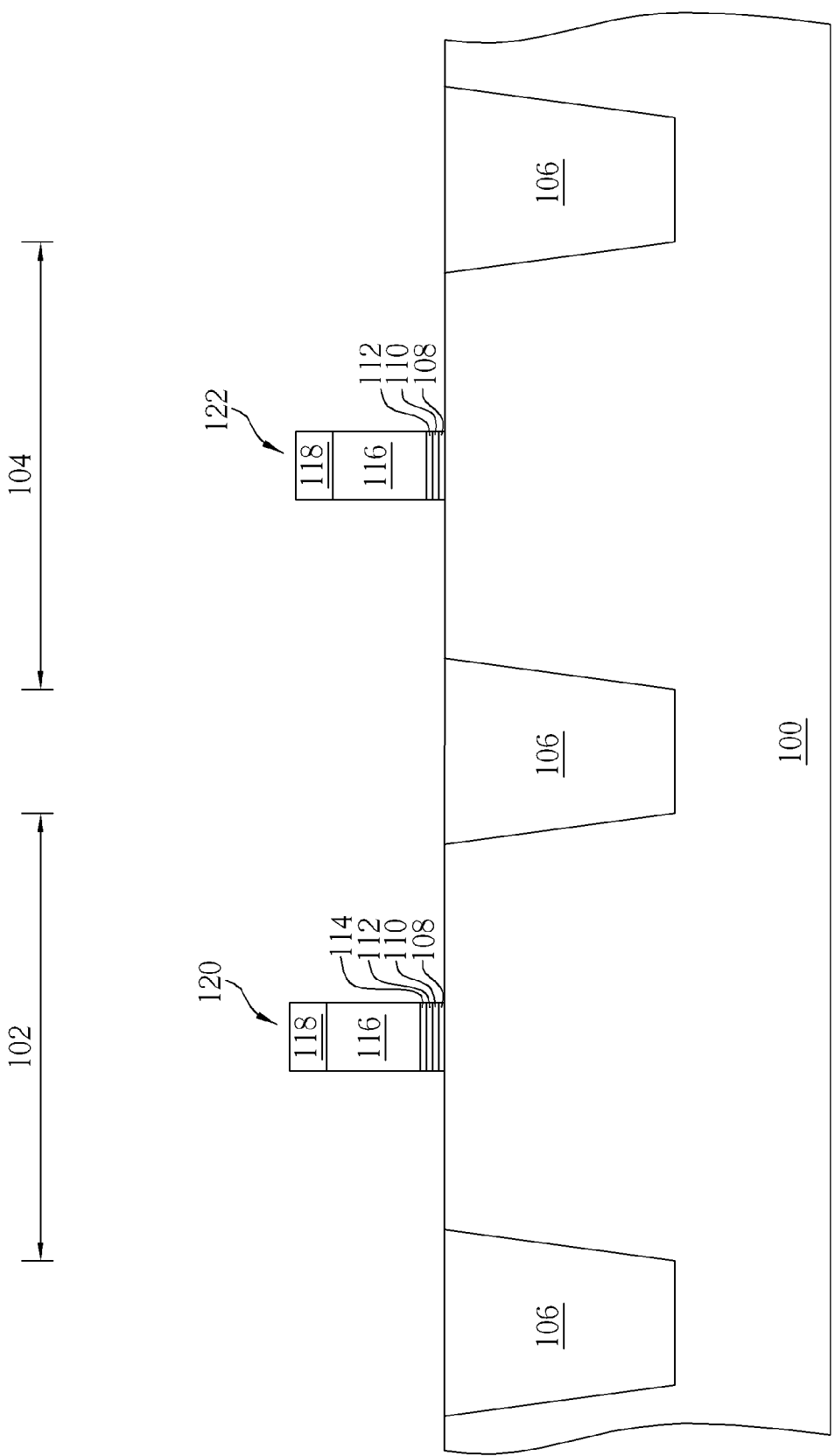

Next, as shown in FIG. 3, a polysilicon layer 116 and a hard mask 118 are formed on the surfaces of the meta layer 114 and the barrier layer 112, and a pattern transfer is conducted by using a patterned resist (not shown) as mask to partially remove the hard mask 118, the polysilicon layer 116, the metal layer 114, the barrier layer 112, the high-k dielectric layer 110, and the interfacial layer 108 through single or multiple etching processes. After stripping the patterned resist, a first gate structure 120 and a second gate structure 122 serving as dummy gate structures are formed on the PMOS region 104 and the NMOS region 102 respectively.

Preferably, the polysilicon layer 116 is used as a sacrificial layer, which could be composed of undoped polysilicon, polysilicon having n+ dopants, or amorphous polysilicon material. The hard mask 118 could be composed of $SiO_2$, SiN, SiC, or SiON.

Figure 4:
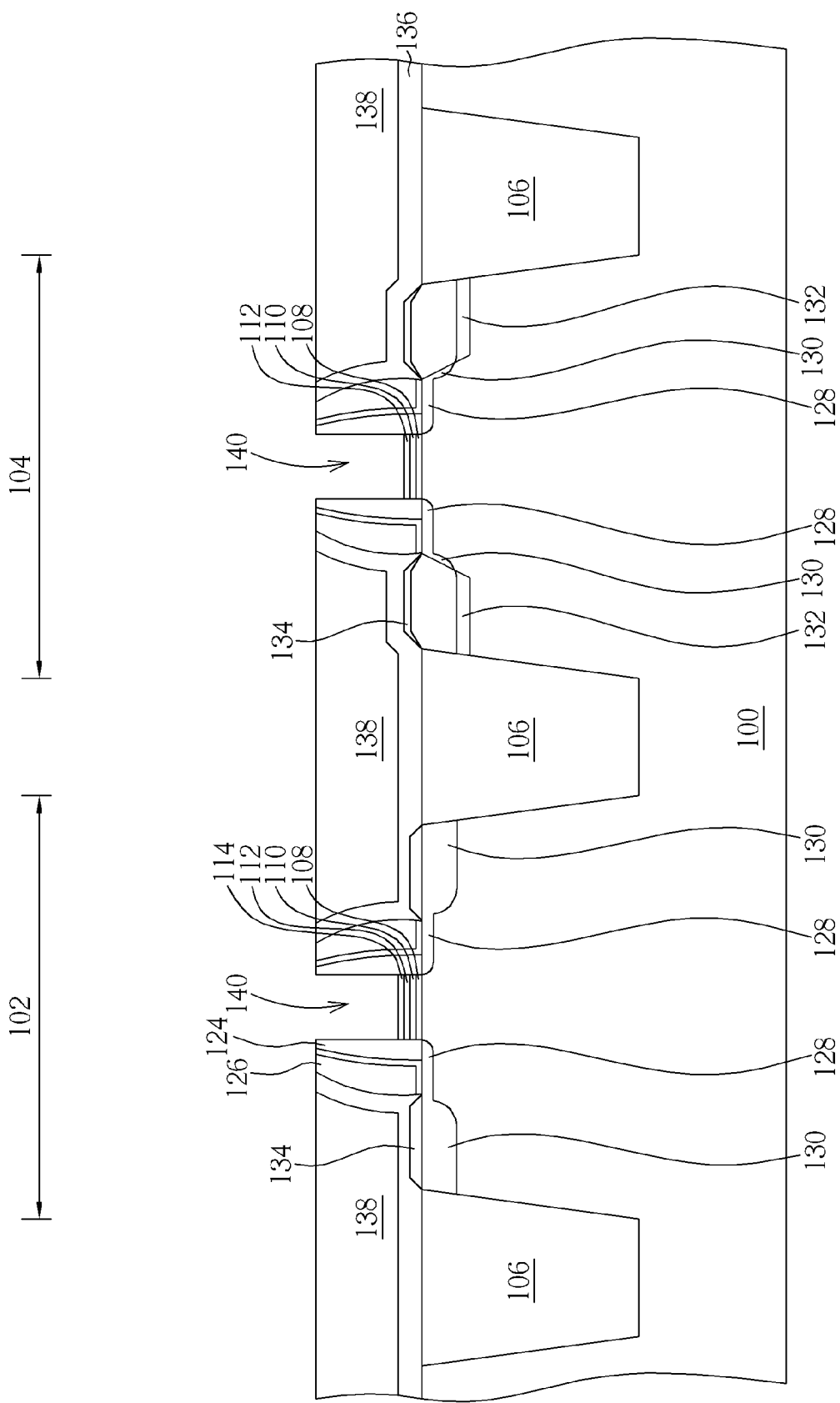

As shown in FIG. 4, a first spacer 124 and a second spacer 126 are formed on the sidewall of the first gate structure 120 and the second gate structure 122 respectively, and a lightly doped drain 128 and source/drain 130 are formed in the substrate 100 adjacent to two sides of the first spacer 124 and the second spacer 126.

A selective epitaxial growth process is carried out on the PMOS and/or NMOS, such as to form an epitaxial layer 132 in the substrate 100 adjacent to two sides of the second spacer 126 of the PMOS region 104. In this embodiment, the epitaxial layer 132 preferably includes silicon germanium, and the epitaxial layer could be formed by following approaches: selective epitaxial growth process through single or multiple layer approach; SEG process accompanying in-situly doping with progression (such as the most bottom layer with no dopants at all, the first layer with slight dopant, the second layer with dopants of higher concentration, the third layer with dopants of high concentration . . . , and the top layer with no dopants at all or slight dopant concentration); alteration of the concentration of hetero atoms (such as the atom Ge in this case), in which the concentration thereof could be altered according to the constant and surface property of the lattice structure while the surface of the lattice would expect to have a lower concentration of Ge atoms or no Ge atoms at all to facilitate the formation of salicides afterwards. Moreover, despite the ion implant for the source/drain 130 of the present embodiment is conducted before the formation of the epitaxial layer 132, the ion implant could also be performed after the epitaxial layer 132 is formed.

Next, a salicide process is performed by first forming a metal selected from a group consisting of cobalt, titanium, nickel, platinum, palladium, and molybdenum on the epitaxial layer 132 and the source/drain 130, and then using at least one rapid thermal anneal process to react the metal with epitaxial layer 132 and the source/drain 130 for forming a silicide layer 134 on the surface of the epitaxial layer 132 and the source/drain 130 of the NMOS region 102 and the PMOS region 104. The un-reacted metal is removed thereafter.

Next, a cap layer 136 is formed on the surface of the substrate 100 to cover the first gate structure 120 and the second gate structure 122, and an interlayer dielectric layer 138 is formed on the substrate 100 to cover both the PMOS region 104 and the NMOS region 102. In this embodiment, the cap layer 136 is preferably composed of silicon nitride, which could have different types of stress in corresponding PMOS region 104 and the NMOS region 102. The interlayer dielectric layer 138 is composed of silicon oxide and the thickness thereof is between 1500-5000 Angstroms and preferably at about 3000 Angstroms.

A planarizing process, such as a chemical mechanical polishing process is then performed to partially remove the interlayer dielectric layer 138, the cap layer 136, and the hard mask 118 and stop of the polysilicon layer 116, and an etching process is carried out thereafter to remove the polysilicon layer 116 from both PMOS region 104 and NMOS region 102 to form a recess 140 in each regions 102 and 104. It should be noted that despite the polysilicon layer 116 is removed from both regions simultaneously, the present invention could also remove the polysilicon layer from one of the two regions and deposit metal into the recess, and then remove polysilicon layer from the other region and deposit metal in thereafter.

Figure 5:
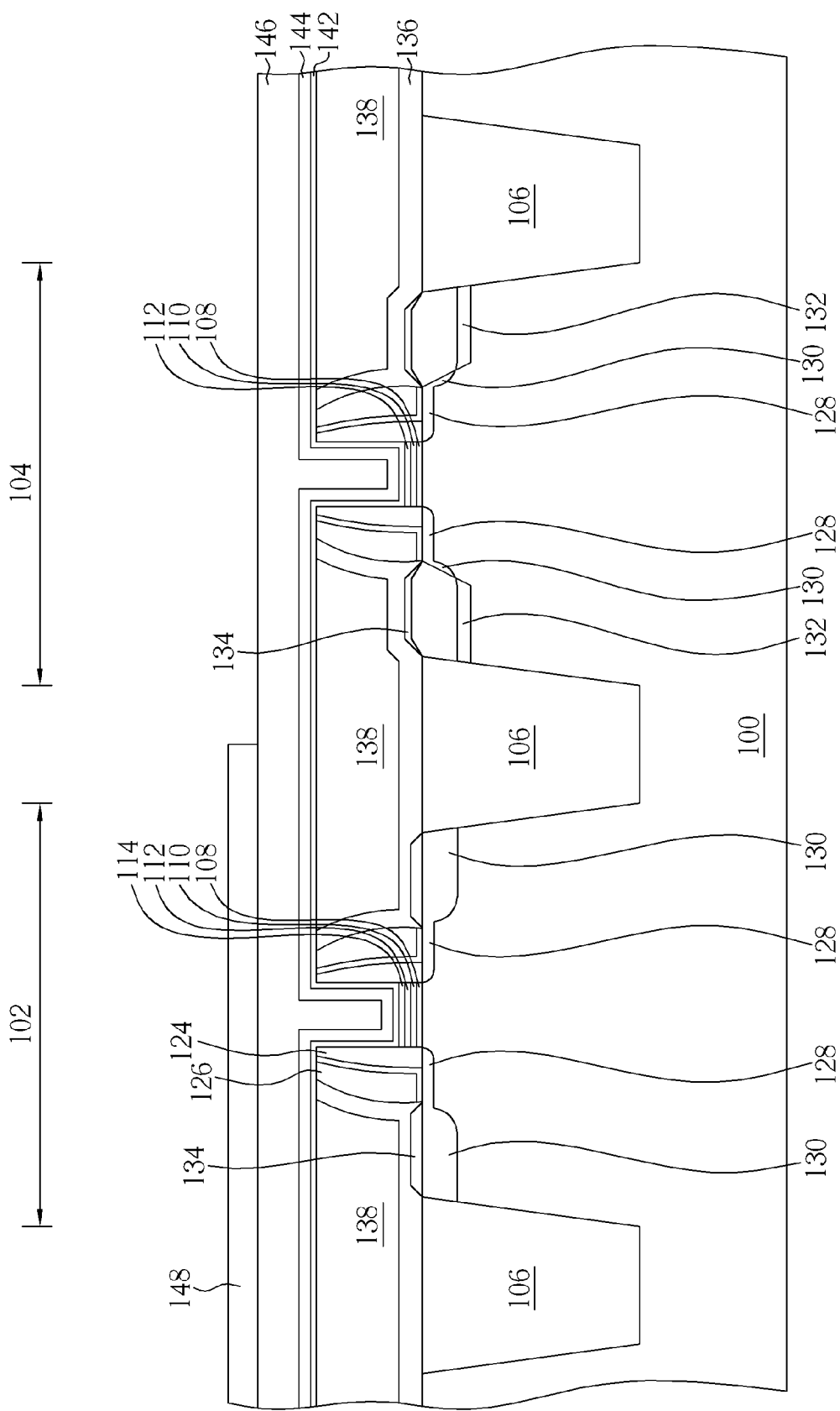

As shown in FIG. 5, a metal layer 142 and a p-type work function metal layer 144 are deposited on the interlayer dielectric layer 138 to cover the bottom and sidewall of each recess 140. The metal layer 142 and the p-type work function metal layer 144 with respect to the top of the recess 140 of the PMOS region 104 is then removed selectively by first forming an anti-reflective coating (ARC) 146 on the surface of the p-type work function metal layer 144 to fill each recess 140, and then forming a patterned resist 148 on the ARC 146 of the NMOS region 102.

Figure 6:
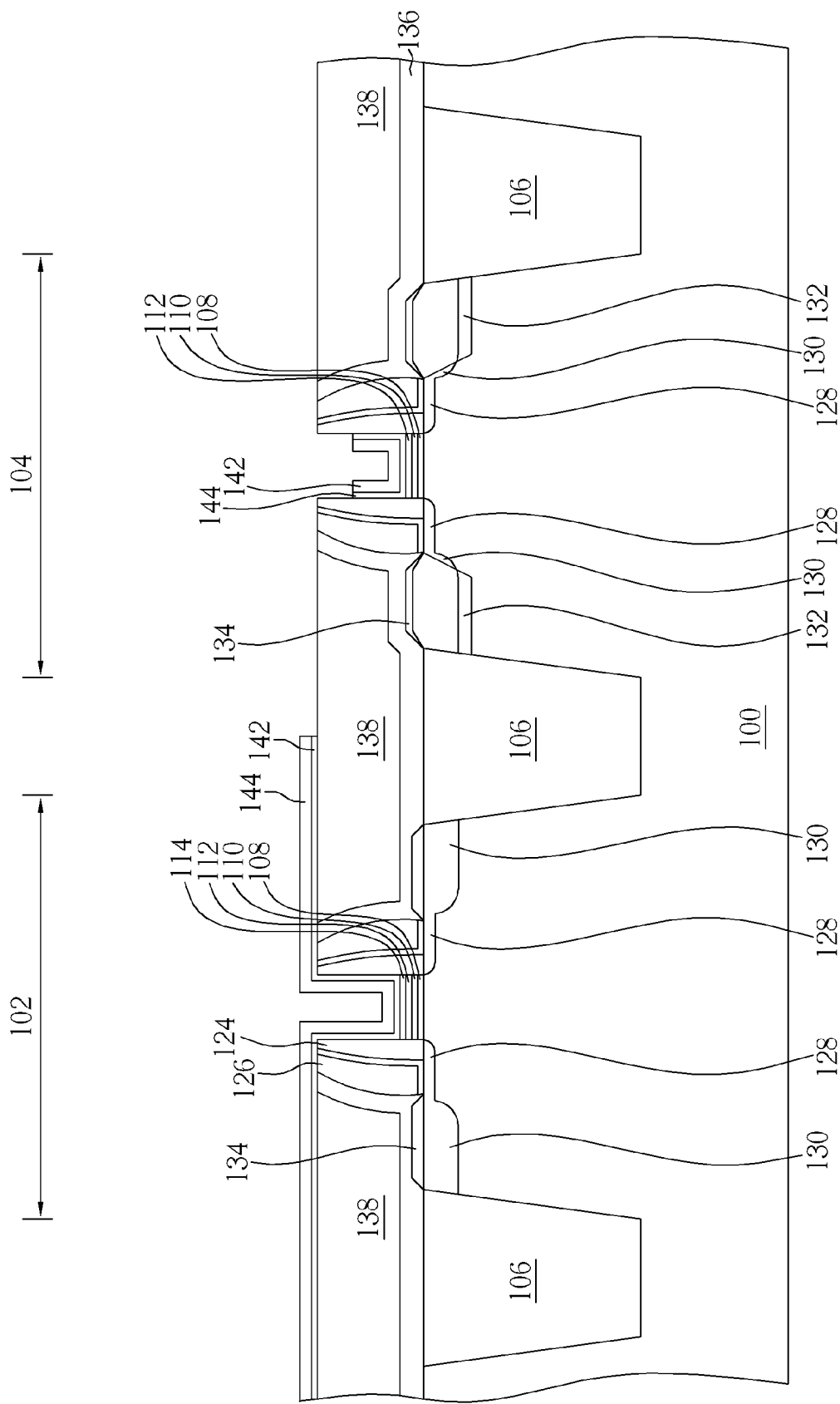

Next, an etching process is performed by using the patterned resist 148 as mask to partially remove the ARC 146 of the PMOS region 104 such that part of the ARC 146 remained in the recess 140 is used as a protective layer to protect the bottom of the recess 140 and the p-type work function metal layer 144 and metal layer 142 on the lower sidewall of the recess 140. Another etching process is then carried out to remove the exposed metal layer 142 and p-type work function metal layer 144 in the PMOS region 104, and the ARC 146 is removed thereafter, as shown in FIG. 6.

Figure 7:
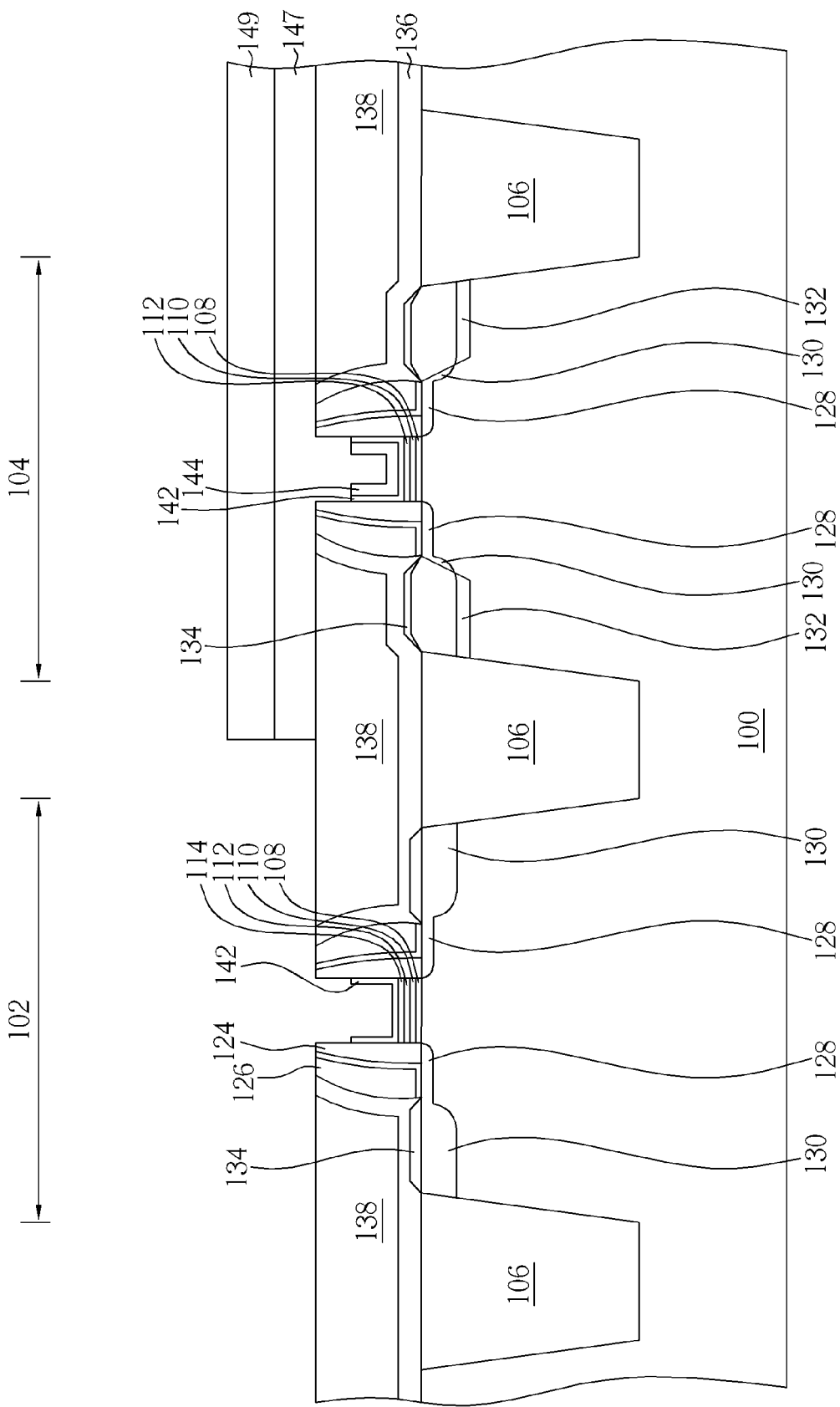

The aforementioned steps are then carried in a similar matter to selectively remove the metal layer 142 and p-type work function metal layer 144 in the top portion of the recess 140 of the NMOS region 102. For instance, an ARC 147 is formed to fill each recess 140, and a patterned resist 149 is formed on the ARC 147 of the PMOS region 104, and an etching process is performed by using the patterned resist 149 as mask to the ARC 147 in the NMOS region 102 such that part of the ARC remained in the recess 140 is used to protect the bottom of the recess 140 and the p-type work function metal layer 144 and metal layer 142 disposed on the lower sidewall of the recess 140. Next, another etching is conducted to remove the exposed metal layer 142 and p-type work function metal layer 144 in the NMOS region 102. As shown in FIG. 7, by using the protection from patterned resist 149 of the PMOS region 104, the ARC 147 and the p-type work function metal layer 144 remained in the recess 140 of the NMOS region 102 are removed sequentially. At this point, the metal layer 142 and p-type work function metal layer 144 are remained in the bottom and lower sidewall of the recess 140 of the PMOS region 104 whereas only the metal layer 142 is remained in the bottom and lower sidewall of the recess 140 of the NMOS region 102, in which the metal layer 142 of each region is substantially lower than the depth of each recess 140.

Figure 8:
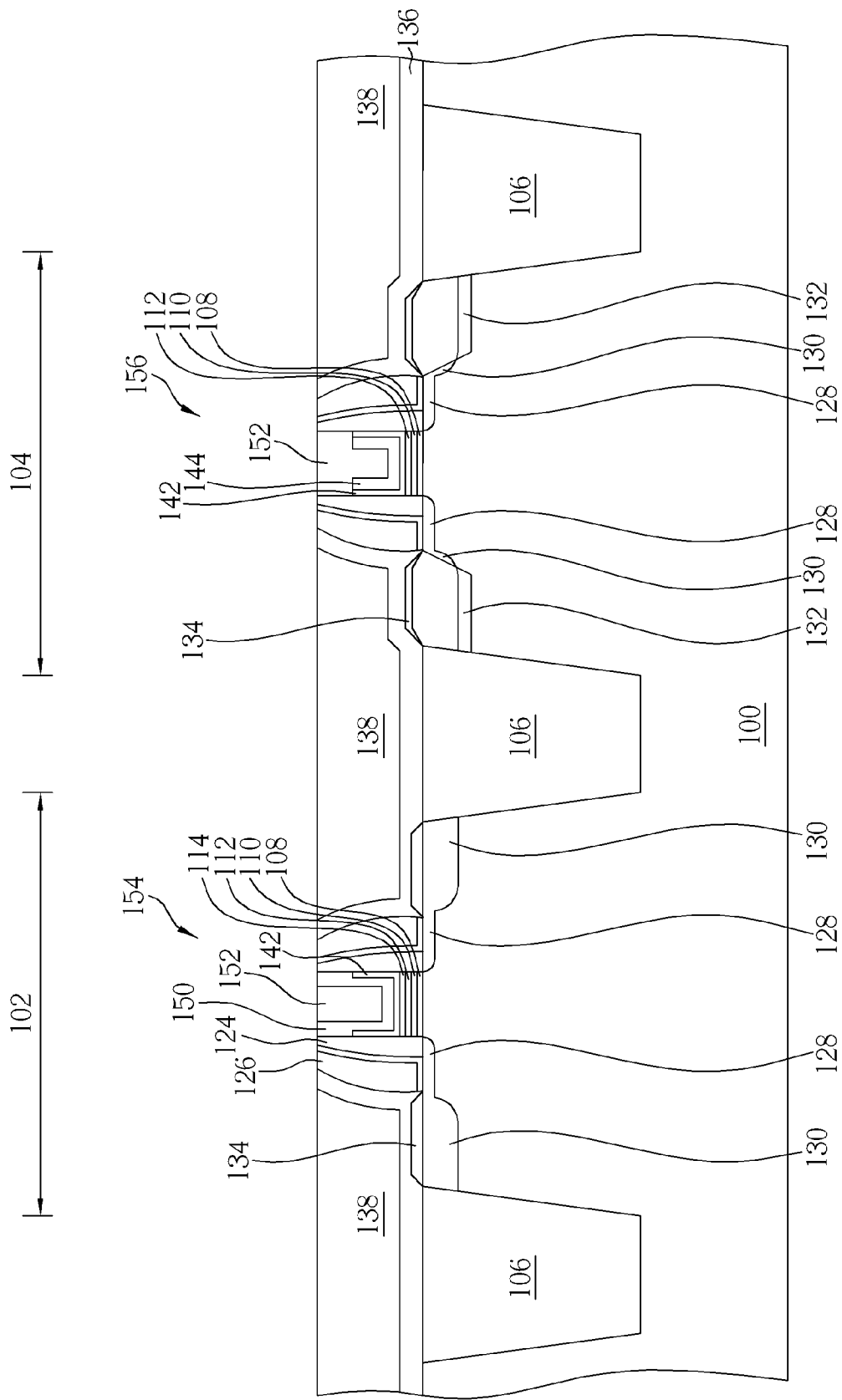

The aforementioned steps could be repeated to form an n-type work function metal layer 150 in the recess 140 and on the surface of the p-type work function metal layer 144 of the NMOS region 102. As shown in FIG. 8, a low resistivity conductive layer 152 is formed to fill the recess 140 and one ore multiple planarizing processes, such as chemical mechanical polishing could be performed on the NMOS region and the PMOS region simultaneously or separately to partially remove the conductive layer 152, the n-type and p-type work function metal layers 150/144, the metal layer 142, and the interlayer dielectric layer 138 to form a first metal gate 154 and a second metal gate 156 in the PMOS region 104 and NMOS region 102 respectively.

In this embodiment, the metal layer 142 is preferably composed of TaN, and the thickness thereof is between couple Angstroms to dozen Angstroms, such as about 10 Angstroms. The p-type work function metal layer 144 is selected from a group consisting of TiN and TaC, but not limited thereto. The n-type work function metal layer 150 is selected from a group consisting of TiAl, ZrAl, WAl, TaAl, and HfAl, but not limited thereto. The conductive layer 152 is selected from a group consisting of Al, Ti, Ta, W, Nb, Mo, Cu, TiN, TiC, TaN, Ti/W, and composite metal such as Ti/TiN, but not limited thereto.

Figure 9:
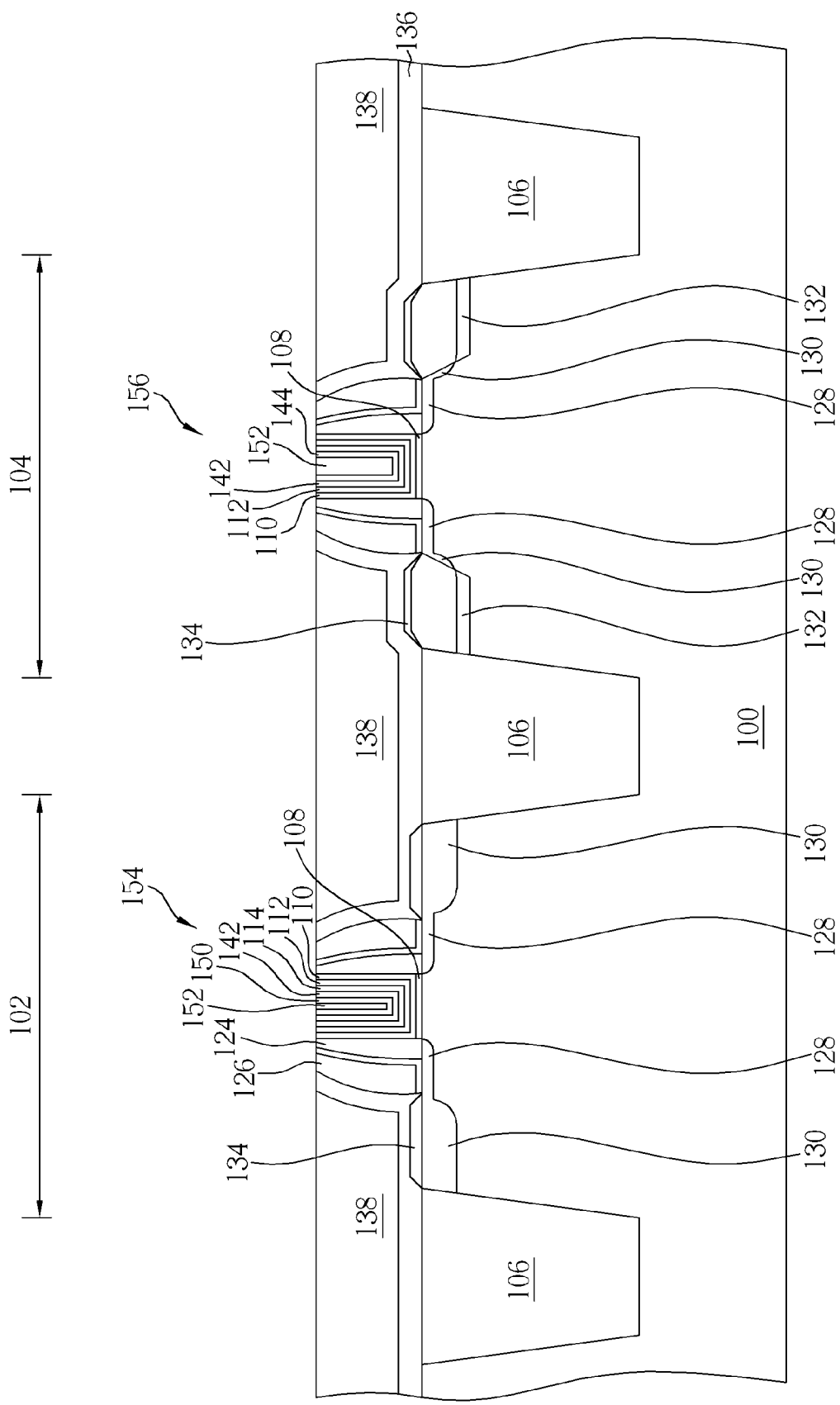

It should be noted that despite the aforementioned embodiment applies to a high-k first process, the present invention could also be applied to a high-k last process. For instance, as shown in FIG. 9, a dummy gate of FIG. 3 could be first formed on a substrate 100, in which the dummy gate only includes an interfacial layer, a polysilicon layer, and a hard mask. Next, following the process carried out from FIG. 4, a first spacer 124 and a second spacer 126 are formed around the dummy gate, a lightly doped drain 128 and a source/drain 130 are formed in the substrate 100 adjacent to two sides of the first spacer 124 and second spacer 126, a cap layer 136 and an interlayer dielectric layer 138 are formed on the dummy gate and the substrate 100, a planarizing process is performed to partially remove the cap layer 136 and the interlayer dielectric layer 138, and polysilicon layer is removed from the dummy gate. Next, a high-k dielectric fabrication could be performed, as shown in FIG. 9, to sequentially form a high-k dielectric layer 110, a barrier layer 112, a first metal layer 114 in the recess of the PMOS region 104 and NMOS region 102. After removing the first metal layer 114 from the PMOS region 104, a second metal layer 142 is formed on the interlayer dielectric layer 138 of the NMOS region 102 and PMOS region 104.

The first metal layer 114 and the second metal layer 142 are preferably composed of TaN, in which the thickness of the first metal layer 114 is between couple Angstroms to dozen Angstroms, such as about 20 Angstroms whereas the thickness of the second metal layer is also between couple Angstroms to dozen Angstroms, such as about 10 Angstroms. As the first metal layer 114 is removed from the PMOS region 104, the total thickness of TaN in the NMOS region 102 is for instance about 30 Angstroms while the total thickness of TaN in the PMOS region 104 is only 10 Angstroms.

According to another embodiment of the present invention, if the first metal layer is deposited with a thickness of 30 Angstroms from the beginning, only one etching process is needed to remove the first metal layer from the PMOS region 104 and there is no need of forming a second metal layer thereafter. By following this approach, there is a total of 30 Angstroms of TaN formed in the NMOS region 102 while no TaN is formed in the PMOS region 104.

Next, steps disclosed in the previous embodiment could be carried out to form an n-type work function metal layer 150 and a p-type work function metal layer 144 in the NMOS region 102 and PMOS region 104, form a conductive layer 152 on the n-type and p-type work function metal layers to fill the recess, and perform another planarizing process to form a metal gate 154 and 156 in the NMOS region 102 and PMOS region 104.

Overall, as TaN metal used in metal gate fabrication typically affects the work function metal layer of the PMOS transistor, the present invention preferably removes the TaN metal in the PMOS region before or after the dummy gate is formed to lower the thickness of TaN metal as much as possible. As a result, the performance of the PMOS transistor is unaffected. According to a preferred embodiment of the present invention, the timing of depositing TaN metal and removing TaN metal could be either before or after the formation of dummy gate, in which the TaN metal could be deposited twice and TaN of PMOS region is removed after, or depositing the TaN metal only once and removing all the TaN from the PMOS region thereafter, which are all within the scope of the present invention.

Those skilled in the art will readily observe that numerous modifications and alterations of the device and method may be made while retaining the teachings of the invention.

What is claimed is:

1. A semiconductor device, comprising:
a substrate having a first region and a second region;
a first gate structure disposed on the first region, wherein the first gate structure comprises a first high-k dielectric layer, a first work function metal layer, and a first metal layer and a third metal layer disposed between the first high-k dielectric layer and the first work function metal layer, wherein the third metal layer is U-shaped;
a second gate structure disposed on the second region, wherein the second gate structure comprises a second high-k dielectric layer, a second work function metal layer, and a second metal layer disposed between the second high-k dielectric layer and the second work function metal layer, wherein the first metal layer, the second metal layer, and the third metal layer are made of the same material;
a first source/drain disposed in the substrate adjacent to two sides of the first gate structure; and
a second source/drain disposed in the substrate adjacent to two sides of the second gate structure.

2. The semiconductor device of claim 1, wherein the first region comprises a NMOS region and the second region comprises a PMOS region.

3. The semiconductor device of claim 1, further comprising a barrier layer disposed between the first high-k dielectric layer and the first metal layer and between the second high-k dielectric layer and the second metal layer.

4. The semiconductor device of claim 3, wherein the barrier layer comprises TiN.

5. The semiconductor device of claim 1, wherein the first metal layer and the second metal layer comprise TaN.

* * * * *